United States Patent
Minami

(10) Patent No.: US 7,268,071 B2
(45) Date of Patent: Sep. 11, 2007

(54) DUAL DAMASCENE INTERCONNECTIONS HAVING LOW K LAYER WITH REDUCED DAMAGE ARISING FROM PHOTORESIST STRIPPING

(75) Inventor: Masaki Minami, Fishkill, NY (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 20 days.

(21) Appl. No.: 11/034,309

(22) Filed: Jan. 12, 2005

(65) Prior Publication Data
US 2006/0154471 A1 Jul. 13, 2006

(51) Int. Cl.
*H01L 21/4763* (2006.01)
(52) U.S. Cl. .................. 438/637; 438/618; 438/687
(58) Field of Classification Search .............. 438/618, 438/637, 687
See application file for complete search history.

(56) References Cited

U.S. PATENT DOCUMENTS

| | | | |
|---|---|---|---|
| 2001/0014534 A1 | 8/2001 | Aoki et al. .............. 438/689 |
| 2003/0130147 A1 | 7/2003 | Koito et al. .............. 510/175 |
| 2003/0235996 A1 | 12/2003 | Leon et al. .............. 438/710 |
| 2004/0050406 A1 | 3/2004 | Sehgal .................... 134/26 |
| 2004/0053498 A1* | 3/2004 | Kaji et al. .............. 438/687 |
| 2004/0087166 A1 | 5/2004 | Morrow ................... 438/694 |

* cited by examiner

*Primary Examiner*—Douglas M. Menz
(74) *Attorney, Agent, or Firm*—Mayer & Williams PC; Stuart H. Mayer, Esq.; Karin L. Williams Esq.

(57) ABSTRACT

A method and apparatus is provided for fabricating a dual damascene interconnection. The method begins by forming on a substrate a dielectric layer that includes an organosilicon material, forming a via photoresist pattern over the dielectric layer, and etching a via in the dielectric layer using the via photoresist pattern as an etch mask. The via photoresist pattern is removed and a trench photoresist pattern is formed over the dielectric layer. A trench, connected to the via, is etched in the dielectric layer using the trench photoresist pattern as an etch mask. The trench photoresist pattern is removed and carbon ions are implanted into exposed surfaces of the via and the trench. A barrier layer is formed that overlies the via and the trench. Finally, interconnections are completed by filling the trench and the via with copper.

11 Claims, 5 Drawing Sheets

DUAL DAMASCENE INTERCONNECTIONS HAVING LOW K LAYER WITH REDUCED DAMAGE ARISING FROM PHOTORESIST STRIPPING

FIELD OF THE INVENTION

The present invention relates generally to dual damascene interconnections for integrated circuits, and more specifically to a dual damascene interconnection having a low k layer with reduced damage from photoresist stripping.

BACKGROUND OF THE INVENTION

The manufacture of integrated circuits in a semiconductor device involves the formation of a sequence of layers that contain metal wiring. Metal interconnects and vias which form horizontal and vertical connections in the device are separated by insulating layers or inter-level dielectric layers (ILDs) to prevent crosstalk between the metal wiring that can degrade device performance. A popular method of forming an interconnect structure is a dual damascene process in which vias and trenches are filled with metal in the same step to create multi-level, high density metal interconnections needed for advanced high performance integrated circuits. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

One important step in the dual damascene fabrication process is the application of organic photoresist material as a precursor to formation of features such as vias and trenches on a substrate using photolithographic techniques. Often additional coatings, for example an anti-reflective coating known in the industry as BARC (Bottom Antireflective Coating), are applied to the substrate to enhance the lithography process.

Once lithography is completed, the resist, BARC and other coatings used for the lithography steps must be removed from the substrate. Undesired resist and/or resist residue can have deleterious effects on subsequent processes such as metallization, or cause undesirable surface states and charges. A common technique for photoresist removal involves placing the substrate in an asher and burning the resist and associated coatings using a gaseous plasma. While the high temperature in the plasma process chamber oxidizes the photoresist and removes it, the plasma etch process leaves post-ash residues—undesirable byproducts from the reaction of the plasma gases, reactant species and the photoresist. The plasma gases that may be used include $N_2/H_2$, $N_2/O_2$, $O_2/CO$, and $O_2/Ar$, for example.

The plasma etch procedure for resist removal is less desirable for substrates having organic low k films as insulating layers. In particular, these insulating layers are porous and are thus more likely to absorb etch gases which can later out-gas and attack metal contacts formed into the substrate (e.g., dual damascene copper). In addition, etchants can damage the organic low k films by the removal of carbon.

Accordingly, it would be desirable to provide a dual damascene interconnect in which photoresist can be removed without a deleterious affect on the underlying low k layer.

SUMMARY OF THE INVENTION

In accordance with the present invention, a method and apparatus is provided for fabricating a dual damascene interconnection. The method begins by forming on a substrate a dielectric layer that includes an organosilicon material, forming a via photoresist pattern over the dielectric layer, and etching a via in the dielectric layer using the via photoresist pattern as an etch mask. The via photoresist pattern is removed and a trench photoresist pattern is formed over the dielectric layer. A trench, connected to the via, is etched in the dielectric layer using the trench photoresist pattern as an etch mask. The trench photoresist pattern is removed and carbon ions are implanted into exposed surfaces of the via and the trench. A barrier layer is formed that overlies the via and the trench. Finally, interconnections are completed by filling the trench and the via with copper.

In accordance with one aspect of the invention, the barrier layer is selected from the group consisting of tantalum, tantalum nitride, titanium, titanium silicide or zircuonium.

In accordance with another aspect of the invention, before forming the dielectric layer, a lower interconnection is formed on the substrate and an etch stop layer is formed on the lower interconnection.

In accordance with another aspect of the invention, the etch stop layer is formed of at least one of SiC, SiN, and SiCN.

In accordance with another aspect of the invention, the dielectric layer is formed using chemical vapor deposition.

In accordance with another aspect of the invention, before forming the via photoresist pattern, a capping layer is formed on the dielectric layer, and the via is formed in the capping layer and the dielectric layer.

In accordance with another aspect of the invention, the capping layer is formed of at least one of $SiO_2$, SiOF, SiON, SiC, SiN and SiCN.

In accordance with another aspect of the invention, the step of forming the via photoresist pattern includes the step of forming a photoresist pattern on the capping layer to define the via and etching the capping layer and the dielectric layer using the photoresist pattern as an etch mask.

In accordance with another aspect of the invention, the trench photoresist pattern in formed on the capping layer.

In accordance with another aspect of the invention, the etching is a dry etch using $C_xF_y$ or $C_xH_yF_z$ as a main etching gas, and removing the photoresist pattern uses an $H_2$-based plasma.

In accordance with another aspect of the invention, an integrated circuit is provided that has at least one dual damascene interconnection constructed in accordance the aforementioned method.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Herein, an opening exposing a lower interconnection is referred to as a via, and a region where interconnections will be formed is referred to as a trench. Hereinafter, the present invention will be described by way of an example of a via-first dual damascene process. However the present invention is also applicable to other dual damascene processes as well.

In the present invention the aforementioned damage that may be caused to the low k materials by removal of the photoresist after formation of the vias and trenches is largely repaired by implanting carbon into low k material to compensate for the carbon that has been removed during the photoresist stripping process. A method of fabricating dual damascene interconnections according to an embodiment of the present invention will now be described with reference to FIG. 1 through 9.

Figure 1:
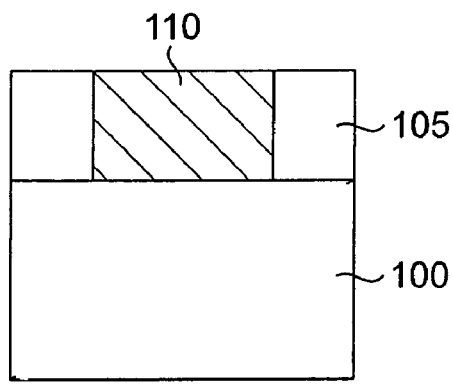
FIGS. 1-9 show cross-sectional views illustrating the formation of a dual damascene structure constructed in accordance with the present invention.

As shown in FIG. 1, a substrate 100 is prepared. A lower ILD 105 including a lower interconnection 110 is formed on the substrate 100. The substrate 100 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 100. The lower interconnection 110 may be formed of various interconnection materials, such as copper, copper alloy, aluminum, and aluminum alloy. The lower interconnection 110 is preferably formed of copper because of its low resistance. Also, the surface of the lower interconnection 110 is preferably planarized.

Figure 2:
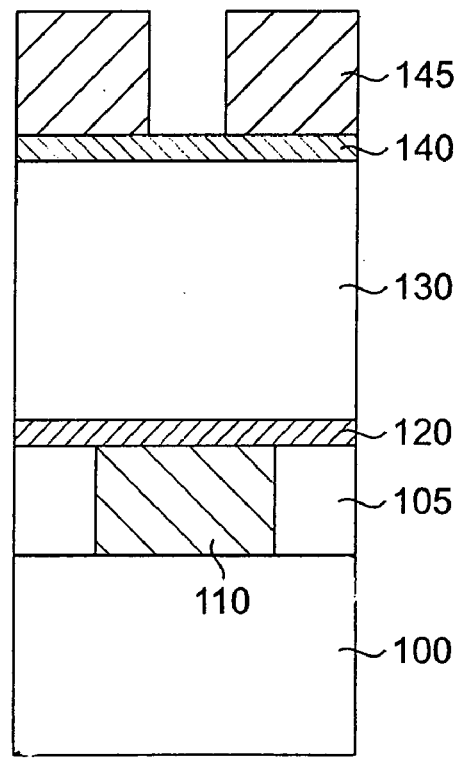

Referring to FIG. 2, an etch stop layer 120, a low-k ILD 130, and a capping layer 140 are sequentially stacked on the surface of the substrate 100 where the lower interconnection 110 is formed, and a photoresist pattern 145 is formed on the capping layer 140 to define a via.

The etch stop layer 120 is formed to prevent electrical properties of the lower interconnection 110 from being damaged during a subsequent etch process for forming a via. Accordingly, the etch stop layer 120 is formed of a material having a high etch selectivity with respect to the ILD 130 formed thereon. Preferably, the etch stop layer 120 is formed of SiC, SiN, or SiCN, having a dielectric constant of 4 to 5. The etch stop layer 120 is as thin as possible in consideration of the dielectric constant of the entire ILD, but thick enough to properly function as an etch stop layer.

The ILD 130 is formed of a hybrid low-k dielectric material, which has advantages of organic and inorganic materials. That is, the ILD 130 is formed of a hybrid low-k dielectric material having low-k characteristics, which can be formed using a conventional apparatus and process, and which is thermally stable. The ILD 130 has a dielectric constant of e.g., 3.5 or less, to prevent an RC delay between the lower interconnection 110 and dual damascene interconnections and minimize cross talk and power consumption. For example, the ILD 130 may be formed of low-k organosilicon material such as Black Diamond™, Silk™, CORAL™, or a similar material. The ILD 130 can be formed using chemical vapor deposition (CVD), and more specifically, plasma-enhanced CVD (PECVD). The ILD 130 may be also formed from low k materials such as spin-on organics and organo silicates. The ILD 130 is formed to a thickness of about 3,000 angstroms to 20,000 angstroms or other appropriate thicknesses determined by those skilled in the art.

The capping layer 140 prevents the ILD 130 from being damaged when dual damascene interconnections are planarized using chemical mechanical polishing (CMP). Thus, the capping layer 140 may be formed of $SiO_2$, SiOF, SiON, SiC, SiN, or SiCN. The capping layer 140 may also function as an anti-reflection layer (ARL) in a subsequent photolithographic process for forming a trench. In this case the capping layer 140 is more preferably formed of $SiO_2$, SiON, SiC, or SiCN.

Figure 3:
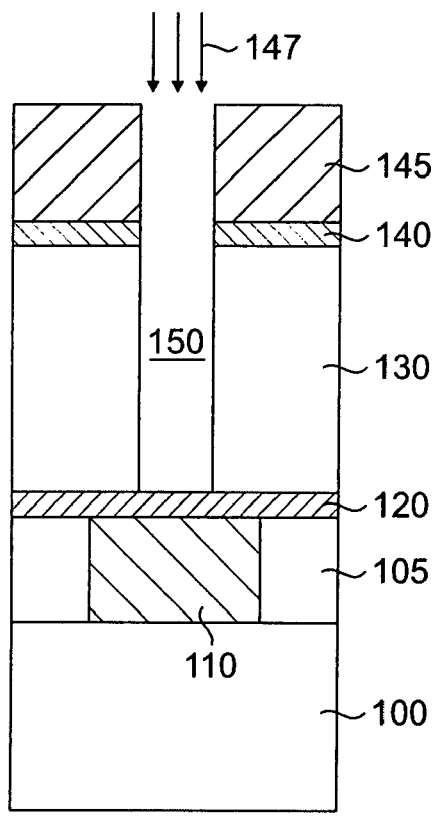

The via photoresist pattern 145 is formed by forming a layer of a photoresist and then performing exposure and developing processes using a photo mask defining a via. Referring to FIG. 3, the ILD 130 is anisotropically etched (147) using the photoresist pattern 145 as an etch mask to form a via 150. The ILD 130 can be etched, for example, using a reactive ion beam etch (RIE) process, which uses a mixture of a main etch gas (e.g., $C_xF_y$ and $C_xH_yF_z$), an inert gas (e.g. Ar gas), and possibly at least one of $O_2$, $N_2$, and $CO_x$. Here, the RIE conditions are adjusted such that only the ILD 130 is selectively etched and the etch stop layer 120 is not etched.

Figure 4:
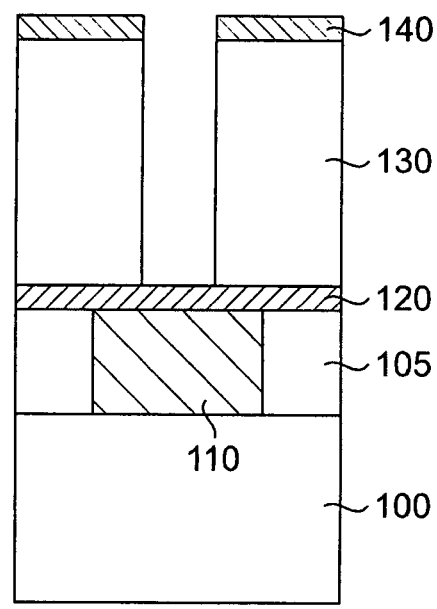

Referring to FIG. 4, the via photoresist pattern 145 is removed using a plasma etch, for example. As previously mentioned, the ILD 130, which is formed from a hybrid low k material containing carbon, may be damaged by the photoresist removal process. In particular, the removal process can also remove carbon from the hybrid low k material, thereby causing damage to the ILD 130.

Figure 5:
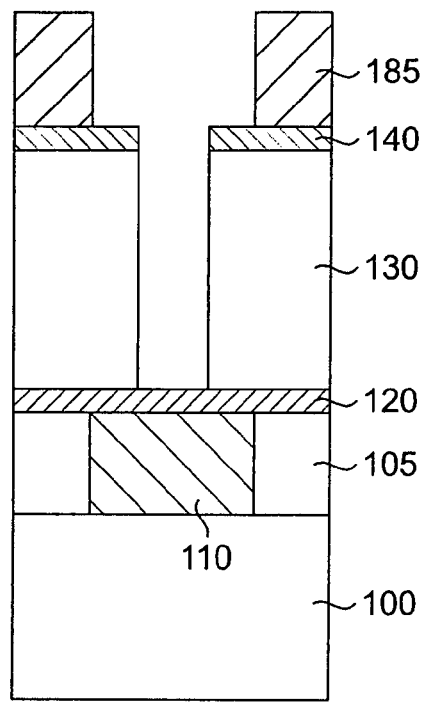
Figure 6:
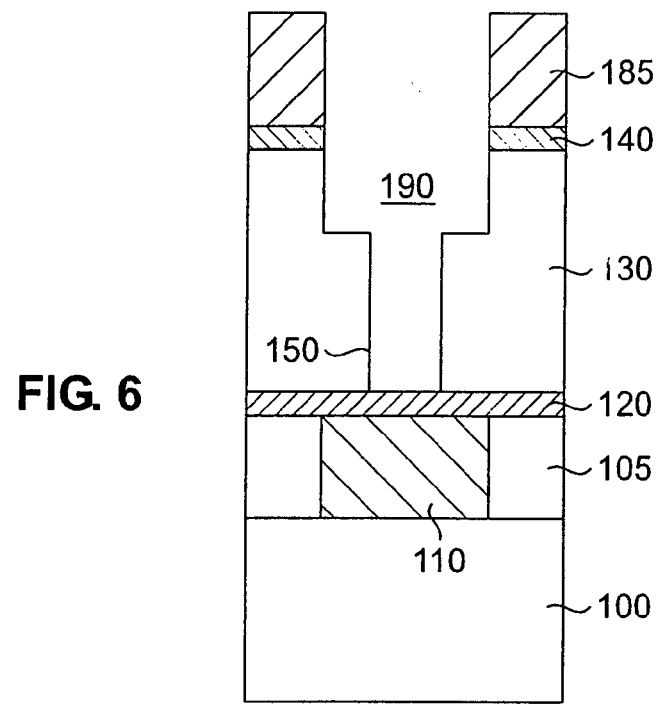

Referring to FIG. 5, a trench photoresist pattern 185 is formed, followed by formation of a trench 190 in FIG. 6. The capping layer 140 is etched using the photoresist pattern 185 as an etch mask, and then the ILD 130 is etched to a predetermined depth to form the trench 190. The resulting structure, shown in FIG. 7, defines a dual damascene interconnection region 195, which includes the via 150 and the trench 190.

Figure 7:
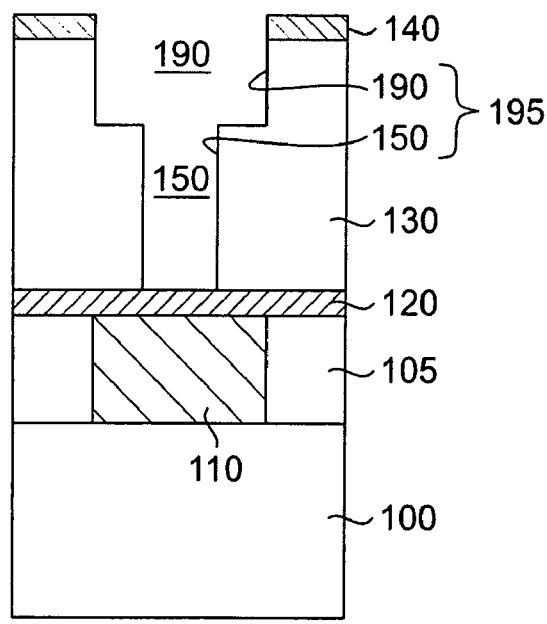

In accordance with the present invention, an ion implantation step is performed after the photoresist is removed. In particular, carbon ions are implanted into the ILD 130 to compensate for the carbon that is removed during the photoresist stripping process. As indicated in FIG. 7, an angled implantation process may be employed to ensure substantially complete coverage of the ILD 130 by the carbon ions. Various parameters of the implantation step such as dopant dosages and dopant energy levels can be determined by any technique (including empirical techniques) available to those of ordinary skill in the art. In one illustrative embodiment, the energy level of the implant process is selected such that carbon ions are implanted to a predetermined depth into the original thickness of the OLD 130. The predetermined depth should be sufficient to restore all or substantially all of the carbon atoms that were removed during the photoresist stripping process.

Figure 8:
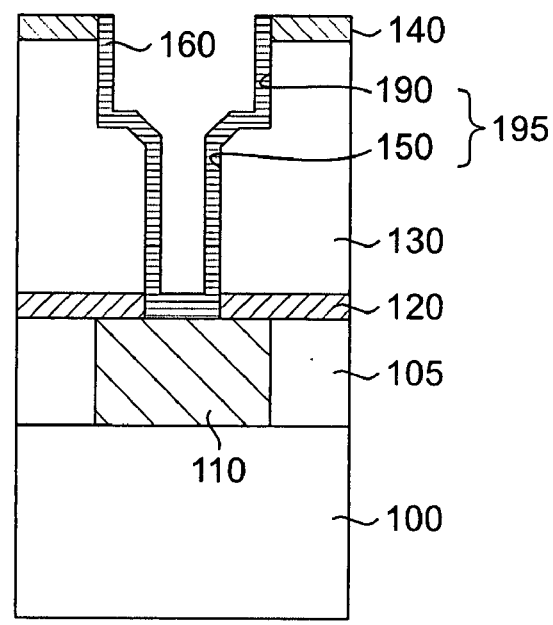

Referring to FIG. 8, the etch stop layer 120 exposed in the via 150 is etched until the lower interconnection 110 is exposed, thereby completing the dual damascene interconnection region 195. The etch stop layer 120 is etched so that the lower interconnection 110 is not affected and only the etch stop layer 120 is selectively removed.

Figure 9:
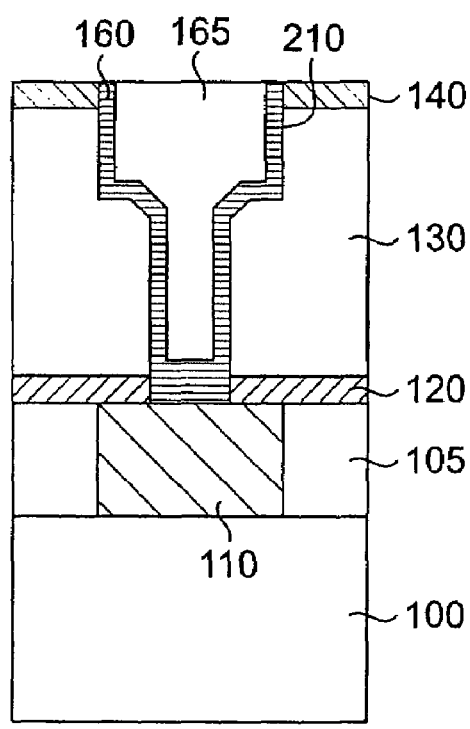

A barrier layer 160 is formed on the dual damascene interconnection region 195 to prevent the subsequently formed conductive layer from diffusing into ILD 130. The barrier layer 160 is generally formed from a conventional material such as tantalum, tantalum nitride, titanium, titanium silicide or zirconium. After formation of the barrier layer 160 the copper conductive layer is formed on the barrier layer by an electroplating process. Referring to FIG. 9, the bulk copper layer 165 is formed on the dual damascene interconnection region 195 by electroplating and then planarized, thereby forming a dual damascene interconnection 210.

Although various embodiments are specifically illustrated and described herein, it will be appreciated that modifications and variations of the present invention are covered by the above teachings and are within the purview of the appended claims without departing from the spirit and intended scope of the invention. For example, those of ordinary skill in the art will recognize that the via-first dual damascene process described with reference to FIGS. 1 through 9 can be applied to a trench-first dual damascene process.

The invention claimed is:

1. A method of fabricating a dual damascene interconnection, the method comprising:
   (a) forming on a substrate a dielectric layer that includes an organosilicon material;
   (b) forming a via photoresist pattern over the dielectric layer;
   (c) etching a via in the dielectric layer using the via photoresist pattern as an etch mask;
   (d) removing the via photoresist pattern;
   (e) forming a trench photoresist pattern over the dielectric layer;
   (f) etching a trench in the dielectric layer using the trench photoresist pattern as an etch mask, said trench being connected to the via;
   (g) removing the trench photoresist pattern;
   (h) implanting carbon ions into exposed surfaces of the via and the trench;
   (i) forming a barrier layer overlying the via and the trench;
   (j) completing interconnections by filling the trench and the via with copper.

2. The method of claim 1 wherein the barrier layer is selected from the group consisting of tantalum, tantalum nitride, titanium, titanium silicide or zircuonium.

3. The method of claim 1, further comprising, before step (a): forming a lower interconnection on the substrate; and forming an etch stop layer on the lower interconnection.

4. The method of claim 3, wherein the etch stop layer is formed of at least one of SiC, SiN, and SiCN.

5. The method of claim 1, wherein the dielectric layer is formed using chemical vapor deposition.

6. The method of claim 1, further comprising, before step (b), forming a capping layer on the dielectric layer, wherein in step (c), the via is formed in the capping layer and the dielectric layer.

7. The method of claim 6, wherein the capping layer is formed of at least one of $SiO_2$, SiOF, SiON, SiC, SiN and SiCN.

8. The method of claim 6, wherein step (b) comprises: forming a photoresist pattern on the capping layer to define the via; and etching the capping layer and the dielectric layer using the photoresist pattern as an etch mask.

9. The method of claim 8 wherein the trench photoresist pattern is formed on the capping layer.

10. The method of claim 8, wherein the etching is a dry etch using $C_xF_y$ or $C_xH_yF_z$ as a main etching gas, and removing the photoresist pattern uses an $H_2$-based plasma.

11. An integrated circuit having at least one dual damascene interconnection constructed in accordance with the method of claim 1.

* * * * *

UNITED STATES PATENT AND TRADEMARK OFFICE
CERTIFICATE OF CORRECTION

PATENT NO. : 7,268,071 B2 Page 1 of 1
APPLICATION NO. : 11/034309
DATED : September 11, 2007
INVENTOR(S) : Masaki Minami It is certified that error appears in the above-identified patent and that said Letters Patent is hereby corrected as shown below:

Specification, Col. 2, Line 29, after "or", change "zircuonium" to -- zirconium --.

Specification, Col. 2, Line 53, after "pattern", change "in" to -- is --.

Specification, Col. 2, Line 60, after "accordance", insert -- with --.

Claim 2, Col. 6, Line 10, after "1", insert -- , --.

Claim 2, Col. 6, Line 12, after "or", change "zircuonium" to -- zirconium --.

Claim 9, Col. 6, Line 31, after "8", insert -- , --.

Signed and Sealed this

Twenty Second Day of April, 2008

JON W. DUDAS
*Director of the United States Patent and Trademark Office*